(12) United States Patent
Walsh et al.

(10) Patent No.: US 11,480,885 B2
(45) Date of Patent: Oct. 25, 2022

(54) APPARATUS FOR AND METHOD CLEANING A SUPPORT INSIDE A LITHOGRAPHY APPARATUS

(71) Applicant: ASML Holding N.V., Veldhoven (NL)

(72) Inventors: James Hamilton Walsh, Newtown, CT (US); Richard John Johnson, Redding, CT (US); Christopher Rossi Vann, Ithaca, NY (US)

(73) Assignee: ASML Holding N. V., Veldhoven (NL)

( * ) Notice: Subject to any disclaimer, the term of this patent is extended or adjusted under 35 U.S.C. 154(b) by 0 days.

(21) Appl. No.: 17/291,302

(22) PCT Filed: Oct. 22, 2019

(86) PCT No.: PCT/EP2019/078693
§ 371 (c)(1),
(2) Date: May 5, 2021

(87) PCT Pub. No.: WO2020/094388
PCT Pub. Date: May 14, 2020

(65) Prior Publication Data
US 2022/0004112 A1 Jan. 6, 2022

Related U.S. Application Data

(60) Provisional application No. 62/757,854, filed on Nov. 9, 2018.

(51) Int. Cl.
*G03F 7/20* (2006.01)

(52) U.S. Cl.
CPC .......... *G03F 7/70925* (2013.01); *G03F 7/707* (2013.01)

(58) Field of Classification Search
CPC .. G03F 7/707; G03F 7/70925; G03F 7/70758; H01L 21/67028
See application file for complete search history.

(56) References Cited

U.S. PATENT DOCUMENTS

| 6,573,979 B2 * | 6/2003 | Yamada | G03F 7/70925 355/72 |
| 10,002,776 B2 | 6/2018 | Humphrey et al. | |
| 2002/0123112 A1 * | 9/2002 | Wang | G01N 15/1459 435/173.9 |

(Continued)

FOREIGN PATENT DOCUMENTS

| CN | 100553799 C | * 10/2009 | ............. B06B 1/045 |
| CN | 107817654 A | * 3/2018 | ......... G03F 7/70033 |

(Continued)

OTHER PUBLICATIONS

Machine Translation of JP-2002313717, Oct. 2002.*

(Continued)

*Primary Examiner* — Peter B Kim
(74) *Attorney, Agent, or Firm* — Sterne, Kessler, Goldstein & Fox P.L.L.C.

(57) ABSTRACT

An apparatus for and method of cleaning a surface of a support structure in a lithographic system in which a cleaning substrate has at least one motor which causes the cleaning substrate to move laterally across the surface. The cleaning substrate may be provided with a power supply mounted on the cleaning substrate and selectably electrically connectable to the motor.

14 Claims, 5 Drawing Sheets

(56) References Cited

U.S. PATENT DOCUMENTS

| | | |
|---|---|---|
| 2004/0130692 A1 | 7/2004 | Tanaka et al. |
| 2008/0202555 A1 | 8/2008 | Shibazaki |
| 2012/0062858 A1 | 3/2012 | Tanaka et al. |
| 2018/0021818 A1* | 1/2018 | VanHoomissen ............................ H01L 21/67769 451/444 |

FOREIGN PATENT DOCUMENTS

| | | | |
|---|---|---|---|
| EP | 2 034 515 A1 | | 3/2009 |
| EP | 2 037 486 A1 | | 3/2009 |
| JP | H09-306829 A | | 11/1997 |
| JP | 2002313717 A | * 10/2002 | ......... G03F 7/70358 |
| JP | 2009-147227 A | | 7/2009 |
| JP | 2012-523961 A | | 10/2012 |
| KR | 2003-0037575 A | | 5/2003 |
| KR | 20060055801 A | * 5/2006 | |
| KR | 2013-0053528 A | | 5/2013 |
| KR | 20150037543 A | * 4/2015 | |

OTHER PUBLICATIONS

International Search Report and Written Opinion of the International Searching Authority directed to related International Patent Application No. PCT/EP2019/078693, dated Feb. 21, 2020; 9 pages.

Research Disclosure No. 568014, vol. 568, No. 14, Aug. 1, 2011; 3 pages.

* cited by examiner

APPARATUS FOR AND METHOD CLEANING A SUPPORT INSIDE A LITHOGRAPHY APPARATUS

CROSS-REFERENCE TO RELATED APPLICATIONS

This application claims priority of U.S. Provisional Patent Application No. 62/757,854, which was filed on Nov. 9, 2018, and which is incorporated herein in its entirety by reference.

FIELD

The present disclosure relates to methods and systems for cleaning a support such as a clamp that is used to hold a substrate such as a patterning device or wafer inside a lithography apparatus.

BACKGROUND

A lithographic apparatus is a machine that applies a desired pattern onto a substrate such as a wafer of semiconductor material, usually onto a target portion of the substrate. A patterning device, which is alternatively referred to as a mask or a reticle, may be used to generate a circuit pattern to be formed on an individual layer of the wafer. Transfer of the pattern is typically accomplished by imaging onto a layer of radiation-sensitive material (resist) provided on the wafer. In general, a single wafer will contain adjacent target portions that are successively patterned. Here and elsewhere herein the term "substrate" may be used to refer both to a patterning device and a wafer.

Lithography is widely recognized as one of the key steps in the manufacture of ICs and other devices and/or structures. As the dimensions of features made using lithography become smaller, lithography is becoming an even more critical factor for enabling miniature IC or other devices and/or structures to be manufactured.

The illumination systems in lithography tools generate laser radiation at deep-ultraviolet (DUV) wavelengths. One system for generating DUV radiation involves use of a Master Oscillator Power Amplifier (MOPA) dual-gas-discharge-chamber configuration. Similar master oscillator seed providing laser systems with other amplifier configurations such as a power oscillator ("PO") can also be used. These are generally multi-chamber laser systems, e.g., two chamber laser systems, such as those including an oscillator seed pulse generating portion followed by amplification of the seed pulse by an amplifier portion receiving the seed pulse.

Extreme ultraviolet ("EUV") light, e.g., electromagnetic radiation having wavelengths of around 50 nm or less (also sometimes referred to as soft x-rays), and including light at a wavelength of about 13.5 nm, is used in photolithography processes to produce extremely small features on substrates such as silicon wafers. Here and elsewhere herein the term "light" may be used even though it is understood that the radiation described using that term may not in the visible part of the spectrum. Methods for generating EUV light include converting a target material from a liquid state into a plasma state. The target material preferably includes at least one element, e.g., xenon, lithium or tin, with one or more emission lines in the EUV range. In one such method, often termed laser produced plasma ("LPP"), the required plasma is produced by using a laser beam to irradiate a target material having the required line-emitting element.

Both DUV and EUV systems employ some form of patterning device such as a reticle that is imaged on the beam used to illuminate the wafer. Both the patterning device and the wafer are held in place by some form of a clamping structure. For example, an electrostatic chuck (ESC) is used in a lithography apparatus to hold a patterning reticle on a scanning stage. A vacuum chuck or mechanical clamping structures may also be used. In the course of use, the surfaces of these clamping structures may become contaminated. Using reticles as an example, the large number of reticles that are loaded into modern microlithography tools can lead to contamination of the reticle clamping surfaces. This contamination can lead to production issues. For example, the contamination may cause overlay error and lead to the fabrication of nonfunctional devices. There is thus a need to clean these clamping structures to remove contaminants. Manual cleaning of a reticle stage chuck is typically carried out using solvents and wipes. This involves opening the tool for human access which can lead to other contamination, extended productivity loss, and possible damage to the tool.

As another example, for DUV tools automatic movement of a cleaning reticle can cause the surfaces of the reticle to come into contact other parts of the tool during transport, thus potentially spreading contamination. The reticle transport system is designed to minimize reticle distortion on the stage so lateral forces are minimized in the reticle transport system. This essentially forecloses the application of side loads to clean the reticle stage chuck surfaces. With no lateral forces between the reticle and stage chuck cleaning motions are challenging.

Similar contamination problems exist for other clamping surfaces in the lithography tool. It is desirable to mitigate these problems, whether identified herein or elsewhere, or to provide an alternative to existing apparatus or methods.

SUMMARY

The following presents a simplified summary of one or more embodiments in order to provide a basic understanding of the embodiments. This summary is not an extensive overview of all contemplated embodiments, and is not intended to identify key or critical elements of all embodiments nor delineate the scope of any or all embodiments. Its sole purpose is to present some concepts of one or more embodiments in a simplified form as a prelude to the more detailed description that is presented later.

According to one aspect of an embodiment there is disclosed an apparatus for use in cleaning a support structure in a lithographic system, the apparatus comprising a substrate configured to be supported by the support structure and at least one motor mechanically mounted on and coupled to the substrate and arranged to induce motion of the substrate. The at least one motor may comprise, for example, a piezoelectric element, a microelectromechanical machine, or a rotor connected to an offset weight. The apparatus may further comprise a power supply mounted on the substrate and selectably electrically connected to the motor. The power supply may comprise a battery. The substrate may comprise a planar surface and a coating on at least a portion of the planar surface. The coating may be an abrasive coating. The coating may include an absorbed liquid which may comprise an alcohol. The coating may be a drying coating. The apparatus may further comprise at least one sensor mounted on the substrate. The sensor may be configured to measure lateral movement of the substrate. The apparatus may further comprise at least one control unit mounted on the substrate. The control unit may be configured to control at least one parameter relating to motion of the substrate as caused by the motor. The parameter may be an amplitude of the motion or a frequency of the motion or a duration of the motion.

According to one aspect of an embodiment there is disclosed a method of removing particles from a surface of a support within a lithographic apparatus, the method comprising the steps of positioning a substrate on a support structure, the substrate including at least one motor, cleaning the surface of the support by applying causing motion of the substrate such that the substrate moves laterally with respect to the surface while in contact with the surface by supplying power to the motor, and moving the substrate away from the surface. The substrate may be provided with a layer of material and the step of cleaning the surface may comprise causing the layer of material to move laterally with respect to the surface while in contact with the surface by supplying power to the motor. The layer of material may be abrasive. The layer of material may include an absorbed liquid which may comprise an alcohol. The layer of material may be a drying coating. The cleaning step may be performed for a predetermined duration. The substrate may be provided with a control unit mounted on the substrate and wherein one parameter of the cleaning step may be controlled by the control unit. The parameter may be an amplitude of the motion or a frequency of the motion or a duration of the motion.

Further features and advantages of the present invention, as well as the structure and operation of various embodiments of the present invention, are described in detail below with reference to the accompanying drawings. It is noted that the present invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWING

The accompanying drawings, which are incorporated herein and form part of the specification, illustrate the present invention and, together with the description, further serve to explain the principles of the present invention and to enable a person skilled in the relevant art(s) to make and use the present invention.

Figure 1:
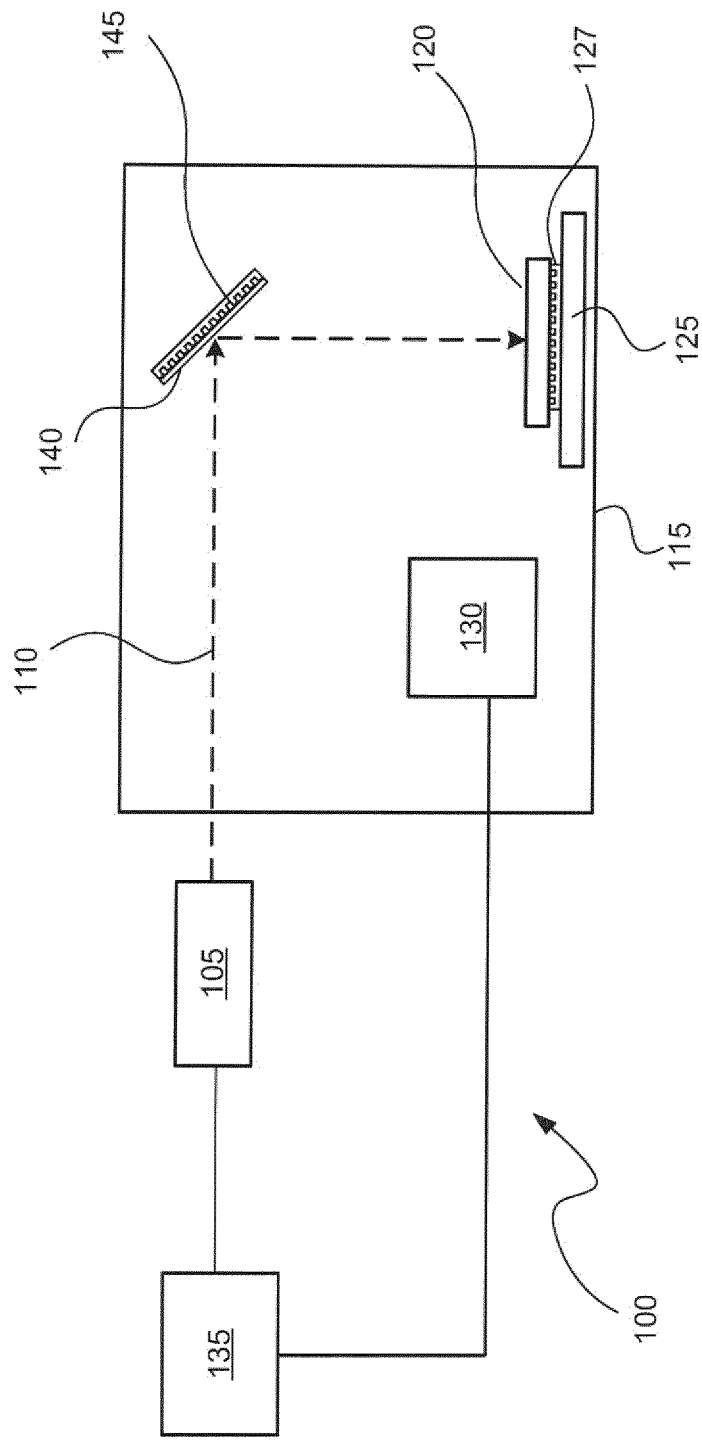
FIG. 1 is a not-to-scale diagram of a lithographic apparatus according to an embodiment of the present invention.

The features and advantages of the present invention will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment", "an embodiment", "an example embodiment", etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Aspects of embodiments of the present invention may be implemented in hardware, firmware, software, or any combination thereof. Embodiments of the present invention may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact result from computing devices, processors, controllers, or other devices executing the firmware, software, routines, instructions, etc.

Before describing such embodiments in more detail, it is instructive to present an example environment in which embodiments of the present invention may be implemented.

Referring to FIG. 1, a photolithography system 100 that includes an illumination system 105. As described more fully below, the illumination system 105 includes a light source that produces a pulsed light beam 110, patterns it, and directs it to a wafer 120. The wafer 120 is placed on a wafer table 125 constructed to hold wafer 120 and connected to a positioner configured to accurately position the wafer 120 in accordance with certain parameters. The wafer table 120 may have a burl top 127 as shown.

A support structure 145 holds the patterning device 140 in a manner that depends on the orientation of the patterning device 140, the design of the lithographic apparatus, and other conditions, such as for example whether or not the patterning device is held in a vacuum environment. The support structure 145 can use mechanical, vacuum, electrostatic or other clamping techniques to hold the patterning device 140. The support structure 145 may be a frame or a table, for example, which may be fixed or movable as required. The support structure 145 may ensure that the patterning device 140 is at a desired position, for example with respect to the projection system. The support structure 145 may also be provided with a burl top as shown.

The term "patterning device" should be broadly interpreted as referring to any device that can be used to impart a pattern to a radiation beam such as to create a pattern in a target portion of the substrate. The pattern imparted to the radiation beam may correspond to a particular functional layer in a device being created in the target portion, such as an integrated circuit.

The patterning device may be transmissive or reflective. As here depicted, the patterning device is a reflective type (e.g., employing a reflective mask). Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam that is reflected by the mirror matrix.

The photolithography system 100 uses a light beam 110, for example, having a wavelength in the DUV range or in the EUV range, as described above. The bandwidth of the light beam 110 can be the actual, instantaneous bandwidth of its optical spectrum (or emission spectrum), which contains information on how the optical energy of the light beam 110 is distributed over different wavelengths. An objective arrangement (not shown) includes a projection lens and enables an image transfer from the patterning device 140 to the wafer 120. The illumination system 105 adjusts the range of angles for the light beam 110 impinging on the mask. The illumination system 105 also homogenizes (makes uniform) the intensity distribution of the light beam 110 across the mask.

The scanner 115 can include, among other features, a lithography controller 130, air conditioning devices, and power supplies for the various electrical components. The lithography controller 130 controls how layers are printed on the wafer 120. The lithography controller 130 includes a memory that stores information such as process recipes. A process program or recipe determines the length of the exposure on the wafer 120, the mask used, as well as other factors that affect the exposure. During lithography, a plurality of pulses of the light beam 110 illuminates the same area of the wafer 120 to constitute an illumination dose.

The photolithography system 100 also preferably includes a control system 135. In general, the control system 135 includes one or more of digital electronic circuitry, computer hardware, firmware, and software. The control system 135 also includes memory which can be read-only memory and/or random access memory. Storage devices suitable for tangibly embodying computer program instructions and data include all forms of non-volatile memory, including, by way of example, semiconductor memory devices, such as EPROM, EEPROM, and flash memory devices; magnetic disks such as internal hard disks and removable disks; magneto-optical disks; and CD-ROM disks.

The control system 135 can also include one or more input devices (such as a keyboard, touch screen, microphone, mouse, hand-held input device, etc.) and one or more output devices (such as a speaker or a monitor). The control system 135 also includes one or more programmable processors, and one or more computer program products tangibly embodied in a machine-readable storage device for execution by one or more programmable processors. The one or more programmable processors can each execute a program of instructions to perform desired functions by operating on input data and generating appropriate output. Generally, the processors receive instructions and data from the memory. Any of the foregoing may be supplemented by, or incorporated in, specially designed ASICs (application-specific integrated circuits). The control system 135 can be centralized or be partially or wholly distributed throughout the photolithography system 100.

The projection system, like the illumination system, may include various types of optical components, such as refractive, reflective, magnetic, electromagnetic, electrostatic or other types of optical components, or any combination thereof, as appropriate for the exposure radiation being used, or for other factors such as the use of a vacuum. It may be desired to use a vacuum for EUV radiation since gases may absorb too much radiation. A vacuum environment may therefore be provided to the whole beam path with the aid of a vacuum wall and vacuum pumps.

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

As mentioned, the clamping surface of the supports can become contaminated over the course of use. Again using a reticle as an example of a substrate, the large number of reticles that are loaded to modern microlithography tools can lead to contamination of the reticle clamping surfaces. This leads to a need to clean those surfaces. Opening the lithography system to allow manual cleaning operations interrupts productivity and can lead to other contamination issues or tool damage from the manual operations. There is thus a need for a system in which clamping surfaces can be cleaned in situ and without any need to take the tool offline and open it.

This need is met according to an aspect of an embodiment through provision of a dedicated cleaning substrate provided with its own source of motive power that can translate laterally, for example, vibrate while in contact with the clamping surface.

Figure 2A:
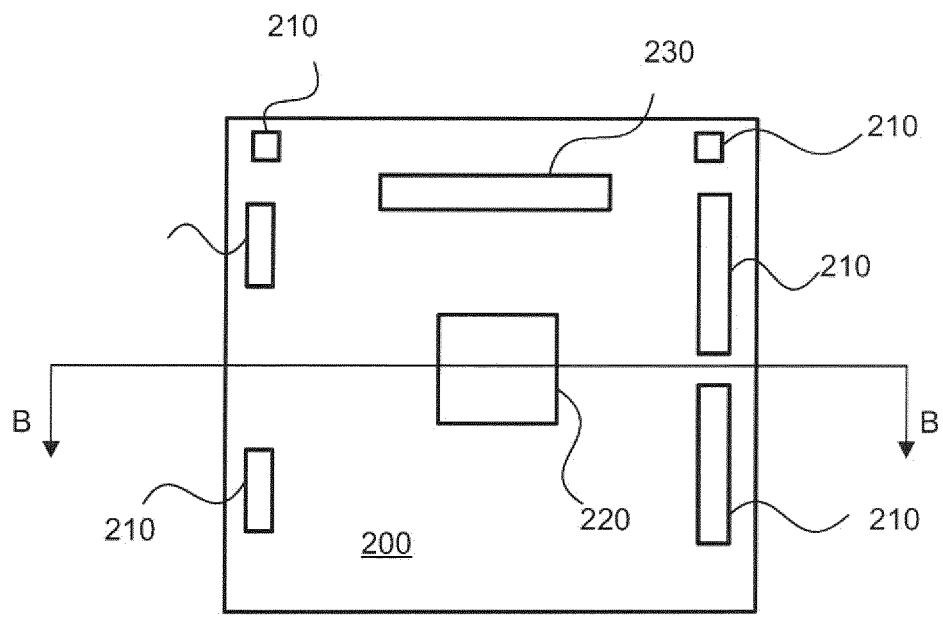
FIG. 2A is a plan view of an embodiment of a cleaning substrate according to an aspect of an embodiment of the invention.

FIG. 2A is a plan view of a dedicated cleaning substrate 200 according to an aspect of an embodiment. The cleaning substrate 200 in FIG. 2A is a cleaning reticle used to clean the reticle stage but it will be understood that other types of cleaning substrates can be used to clean other supports in the lithography tool. The cleaning substrate 200 is configured so it can be transported by the reticle transport system within a lithography tool. It may be provided with markings 210 such as a reticle would normally have such fiducials, prealignment marks, alignment marks, barcodes and the like. Thus the cleaning substrate 200 would have all the marks normally required to allow fully automated loading and transport.

The cleaning substrate 200 is also provided with source of motive power in the form of motor 220. As used herein, the term "motor" means any apparatus or device which is capable of converting supplied energy into a motive force. The motor 220 is mounted on the cleaning substrate 200. As used here and elsewhere herein the term "mounted" means mechanically coupled to the cleaning substrate 200 so as to be transported along with the cleaning substrate 200 and to be essentially synonymous with "onboard." The motor 220 may for example be a piezoelectric device, a microelectromechanical machine, or a pager-type motor including a rotating element and an offset weight. The motor 220 can be arranged to move a base of the cleaning substrate 200 laterally (up and down or side to side in the plane of the figure). The motor 220 and can include two motors, one to reciprocate in one lateral direction and the other to reciprocate in an orthogonal lateral direction. The motor 220 can be made up of multiple motors reciprocating in different directions or the same direction. The motor 220 can move at various speeds including speeds at which the cleaning substrate 200 vibrates.

The arrangement shown in FIG. 2A also includes an onboard electronics module 230. The electronics module 230 is dimensioned so that the cleaning substrate is carrying it within the critical volume limits to permit automated transport. The electronics module 230 generates a drive signal for the motor 220. The electronics module 230 may include an onboard power source. Alternatively, power may be supplied from the reticle stage through a contact on the cleaning reticle 200. In addition to a power source, the electronics module 230 could include logic to determine the vibration pattern (programmable ahead of time, for example, for amplitude, duration, frequency). The electronics module 230 could also include sensors to verify vibration or sense or detect other aspects of the cleaning operation.

Figure 2B:
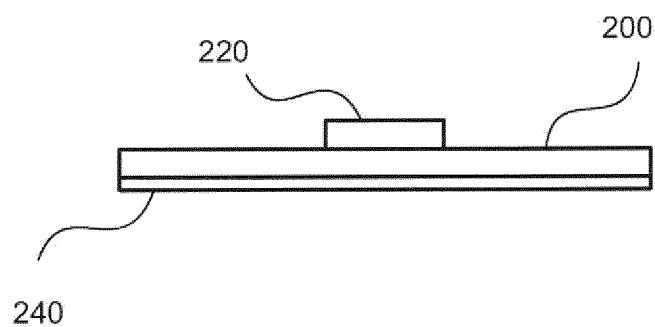
FIG. 2B is a cross-sectional view of the cleaning substrate of FIG. 2A taken along line B-B.

FIG. 2B is a cross section of the cleaning substrate 200 taken along line BB of FIG. 2A. As can be seen, the cleaning substrate 200 may also include a layer 240 to be brought into contact with the clamping surface to be cleaned. The layer 240 may include pads to perform the cleaning. The layer 240 may be abrasive surface, a moist surface with cleaner or alcohol, or a drying surface as necessary or desired. The layer 240 could consist of a thin film with appropriate properties for cleaning the reticle stage chuck. The layer 240 can also be electrostatically charged to attract charged particles from the chuck.

Once the cleaning substrate 200 is on the stage and clamped by a reticle handler gripper, the motor 220 can be actuated to vibrate the cleaning substrate 200 to allow small motions against the reticle chuck and so to perform a cleaning operation. In cleaning, the mass of the cleaning substrate 200 with its motor and electronics together with the reticle handler gripper can provide a normal force on the reticle stage chuck sufficient to permit cleaning. The vibration action allows lateral movement of the cleaning surfaces relative to the reticle chuck contact surface without changing the existing tool that limits lateral forces to limit reticle distortion.

The capability of cleaning the clamp surface in situ (that is, with the clamp in place rather than removed from the chamber and without disturbing the vacuum in the chamber in which the clamp is located) avoids the downtime penalty of removing the clamp.

Figure 3A:
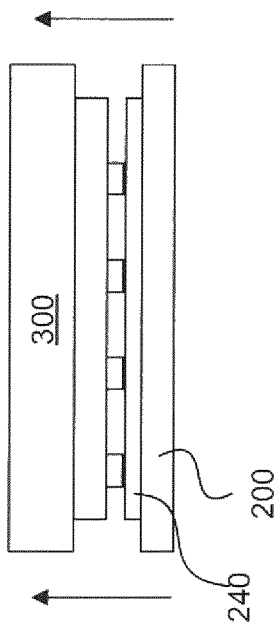
FIGS. 3A-3D are diagrams illustrating the use of a cleaning substrate to clean a clamping structure according to an aspect of an embodiment of the invention.
Figure 3C:
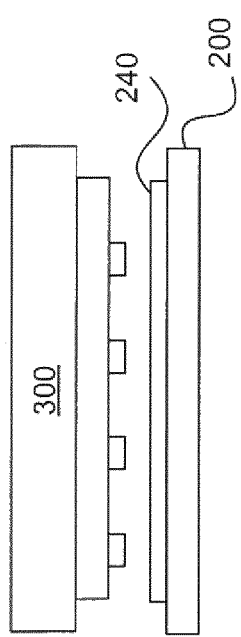
Figure 3B:
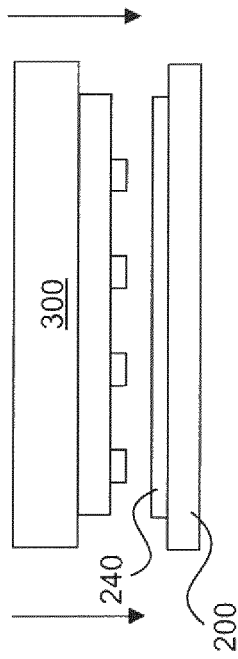
Figure 3D:
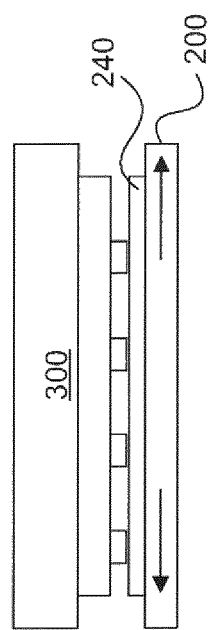

FIGS. 3A-3D illustrate a particle removal process, according to an aspect of embodiment. A side view of a clamping structure 300 is shown along with cleaning substrate 200. In FIG. 3A, the cleaning substrate 200 is prepared to be brought into proximity with a clamping surface of the clamping structure 300. In FIG. 3B, the cleaning substrate 200 is moved into contact with the clamping surface of the clamping structure 300. In FIG. 3C the cleaning substrate 200 is caused to move laterally thus creating a relative lateral displacement of the cleaning substrate 200 with respect to the clamping surface of the clamping structure 300. This relative displacement causes contaminants on the clamping surface to become dislodged and to transfer to the cleaning substrate 200. In FIG. 3D, the cleaning substrate is moved away from the clamping surface. The cleaning substrate 200 can then transported and removed as a conventional reticle might be.

In an embodiment, each of the actions illustrated in FIGS. 3A-3D can be performed automatically within, for example, a lithographic apparatus. Thus, the cleaning procedure may be performed without the need to manually clean clamping structure 300. Manual cleaning of clamping structure 300 within, for example, a lithographic apparatus, would require venting and/or partial disassembling of the apparatus. Additionally, the procedure may be repeated as many times as desired to continue removing any further contaminants from the surface of clamping structure 300. The procedure may be repeated using the same cleaning reticle, a fresh cleaning reticle of the same type, or a cleaning reticle having a different type of layer.

The lateral motion of the cleaning substrate 200 with respect to the surface of the clamping structure 300 may be characterized by several parameters, including amplitude (extent of lateral excursion), frequency of reciprocation, duration, and repetition. Amplitude may be, for example, in the range of micrometers to hundreds of micrometers. The frequency may be, for example, in a range of about 10 Hz to about 1000 Hz. Duration may be, for example, in a range of about 100 milliseconds to perhaps about 10 seconds. Repetition could be repeated as many times as desired limited by a need to replace or perhaps recharge the power source or replace or replenish the cleaning layer.

Figure 4:
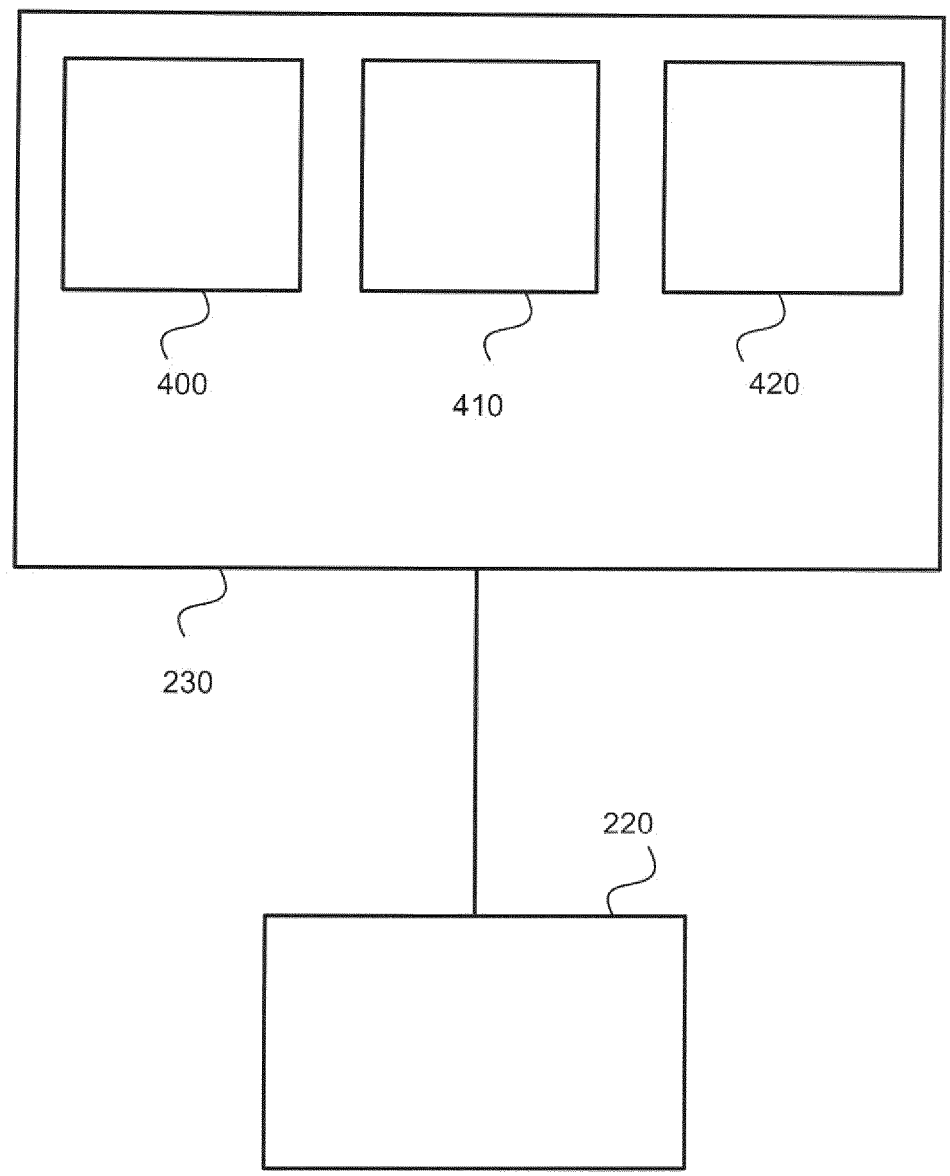
FIG. 4 is a diagram of one possible arrangement of electronic components on a cleaning substrate according to an aspect of an embodiment of the invention.

FIG. 4 is a functional block diagram describing additional details of examples of a motor 220 an electronics module 230. As shown, the electronics module 230 may include a power source 400, logic circuitry 410, and sensors 420. As regards the power source 400, while it is contemplated that the voltage source may be mounted on the substrate, it is also possible to provide the substrate with at least one contact electrically connected to an electrode with the contact being arranged so that it forms a connection with an external voltage supply when the substrate is in its operating position. The on-board power source 400 may comprise a battery and a voltage converter. The on-board power source 400 may also comprise a switching device for selectively connecting the on-board power source 400 to an electrode. The switching device may be activated, for example, by a signal transmitted by a machine interface controllable from outside the vacuum chamber in which the clamping structure 300 is disposed.

Figure 5:
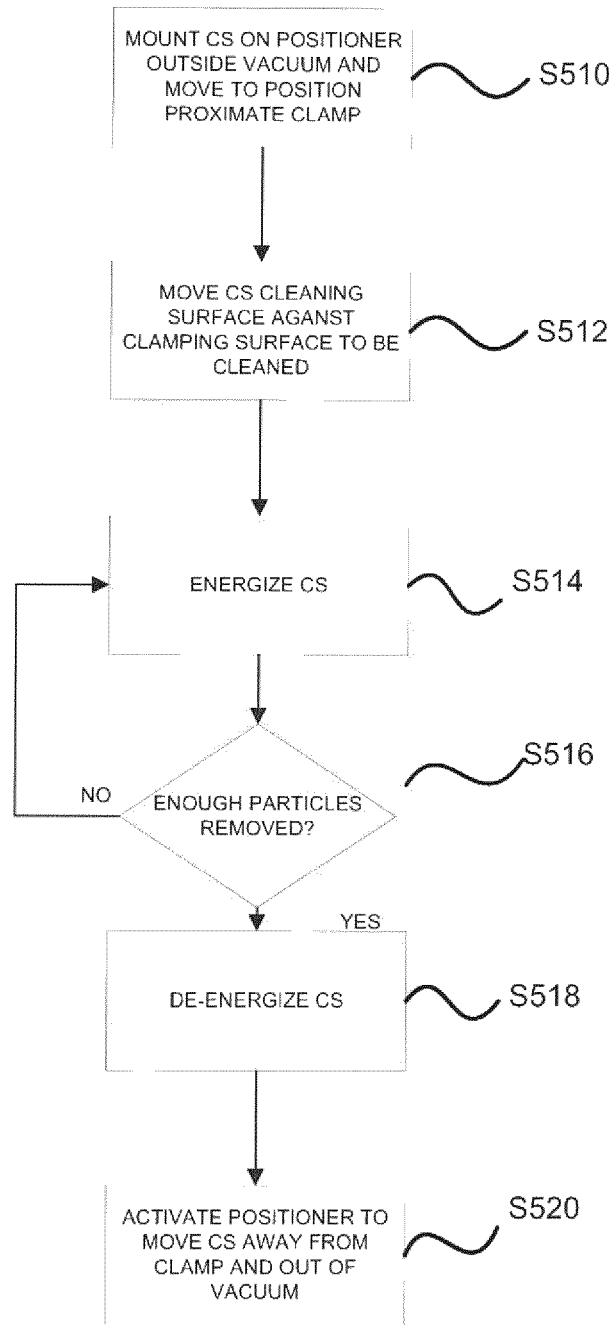
FIG. 5 is flowchart of a possible method of using a cleaning substrate to clean a clamping structure according to an aspect of an embodiment of the invention.

FIG. 5 is a flowchart Illustrating a method of using a cleaning substrate as disclosed. In a step S510 the cleaning substrate, abbreviated CS in the figure, is placed on a positioner outside of vacuum and moved to a position in vacuum proximate to the clamp. In a step S512 the cleaning substrate is moved into contact with the clamping surface to be cleaned. In a step S514 the cleaning substrate is energized, i.e., the motor on the cleaning substrate is connected to a voltage source, so that the cleaning substrate moves in relation to the clamping surface. In a step S516 it is determined whether enough contamination been removed from the clamp. If not enough contamination has been removed, then the method reverts to step S514 and the cleaning substrate remains energized. If enough contamination has been removed, then in step S518 the cleaning substrate is de-energized, i.e., the motor is disconnected from the voltage source. Then in a step S520 the positioner is activated to move the cleaning substrate away from the clamp and out of the vacuum. It should be understood that step S516 could be implemented simply by energizing the cleaning substrate for a predetermined length of time that is known a priori to be sufficient to remove enough particles or step S516 could be implemented by use of monitoring system that examines the clamping surface for contamination and determines when to stop energizing the cleaning substrate based on the results of that examination.

Once the particles have been removed from clamping structure 300, cleaning substrate 200 may be removed to have the particles cleaned off and then re-used.

The embodiments may further be described using the following clauses:

1. Apparatus for use in cleaning a support structure in a lithographic system, the apparatus comprising:
   a substrate configured to be supported by the support structure; and
   at least one motor mechanically coupled to and mounted on the substrate and arranged to induce motion of the substrate.
2. Apparatus of clause 1 wherein the at least one motor comprises a piezoelectric element.
3. Apparatus of clause 1 wherein the at least one motor comprises a microelectromechanical machine.
4. Apparatus of clause 1 wherein the at least one motor comprises a rotor connected to an offset weight.
5. Apparatus of clause 1 further comprising a power supply mounted on the substrate and selectably electrically connected to the motor.
6. Apparatus of clause 5 wherein the power supply comprises a battery.
7. Apparatus of clause 1 wherein the substrate comprises a planar surface and a coating on at least a portion of the planar surface.
8. Apparatus of clause 7 wherein the coating is an abrasive coating.
9. Apparatus of clause 7 wherein the coating includes an absorbed liquid.
10. Apparatus of clause 9 wherein the absorbed liquid comprises an alcohol.
11. Apparatus of clause 7 wherein the coating is a drying coating.
12. Apparatus of any one of clauses 1-11 further comprising at least one sensor mounted on the substrate.
13. Apparatus of clause 12 wherein the sensor is configured to measure lateral movement of the substrate.
14. Apparatus of any one of clauses 1-13 further comprising at least one control unit mounted on the substrate.
15. Apparatus of clause 14 wherein the control unit is configured to control at least one parameter relating to motion of the substrate as caused by the motor.
16. Apparatus of clause 15 wherein the parameter is an amplitude of the motion.
17. Apparatus of clause 15 wherein the parameter is a frequency of the motion.
18. Apparatus of clause 15 wherein the parameter is a duration of the motion.
19. A method of removing particles from a surface of a support within a lithographic apparatus, the method comprising the steps of:
   positioning a substrate on a support structure, the substrate including at least one motor;
   cleaning the surface of the support by applying causing motion of the substrate such that the substrate moves laterally with respect to the surface while in contact with the surface by supplying power to the motor; and
   moving the substrate away from the surface.
20. A method of clause 19 wherein the substrate is provided with a layer of material and the step of cleaning the surface comprises causing the layer of material to move laterally with respect to the surface while in contact with the surface by supplying power to the motor.
21. A method of clause 20, wherein the layer of material is abrasive.
22. A method of clause 20, wherein the layer of material includes an absorbed liquid.
23. A method of clause 22 wherein the absorbed liquid comprises an alcohol.
24. A method of clause 20, wherein the layer of material is a drying coating.
25. A method of clause 19 wherein the cleaning step is performed for a predetermined duration.
26. A method of clause 19 or 20 wherein the substrate is provided with a control unit mounted on the substrate and wherein one parameter of the cleaning step is controlled by the control unit.
27. A method of clause 26 wherein the parameter is an amplitude of the motion.
28. A method of clause 26 wherein the parameter is a frequency of the motion.
29. A method of clause 26 wherein the parameter is a duration of the motion.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

While specific embodiments of the present invention have been described above, it will be appreciated that the present invention may be practiced otherwise than as described. The descriptions above are intended to be illustrative, not limiting. Thus it will be apparent to one skilled in the art that modifications may be made to the present invention as described without departing from the scope of the claims that follow.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the present invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. An apparatus for use in cleaning a support structure in a lithographic system, the apparatus comprising:
    a substrate configured to be supported by the support structure;
    at least one sensor mounted on the substrate; and
    at least one motor mechanically coupled to and mounted on the substrate and arranged to induce motion of the substrate.

2. The apparatus of claim 1, wherein the at least one motor comprises a piezoelectric element.

3. The apparatus of claim 1, wherein the at least one motor comprises a microelectromechanical machine.

4. The apparatus of claim 1, wherein the at least one motor comprises a rotor connected to an offset weight.

5. The apparatus of claim 1, further comprising a power supply mounted on the substrate and selectably electrically connected to the motor.

6. The apparatus of claim 5, wherein the power supply comprises a battery.

7. The apparatus of claim 1, wherein the substrate comprises a planar surface and a coating on at least a portion of the planar surface.

8. The apparatus of claim 7, wherein the coating is an abrasive coating.

9. The apparatus of claim 7, wherein the coating includes an absorbed liquid.

10. The apparatus of claim 9, wherein the absorbed liquid comprises an alcohol.

11. The apparatus of claim 7, wherein the coating is a drying coating.

12. The apparatus of claim 1, wherein the sensor is configured to measure lateral movement of the substrate.

13. An apparatus for use in cleaning a support structure in a lithographic system, the apparatus comprising:
    a substrate configured to be supported by the support structure;
    at least one motor mechanically coupled to and mounted on the substrate and arranged to induce motion of the substrate; and
    at least one control unit mounted on the substrate;
    wherein the control unit is configured to control at least one parameter relating to motion of the substrate as caused by the motor, and
    wherein the parameter is an amplitude of the motion or a frequency of the motion.

14. An apparatus for use in cleaning a support structure in a lithographic system, the apparatus comprising:
    a substrate configured to be supported by the support structure;
    at least one motor mechanically coupled to and mounted on the substrate and arranged to induce motion of the substrate; and
    at least one control unit mounted on the substrate;
    wherein the control unit is configured to control at least one parameter relating to motion of the substrate as caused by the motor, and
    wherein the parameter is a duration of the motion.

* * * * *